(12) United States Patent
Tsubota et al.

(10) Patent No.: US 10,389,370 B2
(45) Date of Patent: Aug. 20, 2019

(54) FREQUENCY CALIBRATION CIRCUIT AND FREQUENCY CALIBRATION METHOD

(71) Applicant: MegaChips Corporation, Osaka (JP)

(72) Inventors: Hidetoshi Tsubota, Chiba (JP); Hideyuki Sato, Chiba (JP)

(73) Assignee: MegaChips Corporation, Osaka (JP)

( * ) Notice: Subject to any disclaimer, the term of this patent is extended or adjusted under 35 U.S.C. 154(b) by 216 days.

(21) Appl. No.: 15/374,008

(22) Filed: Dec. 9, 2016

(65) Prior Publication Data

US 2017/0170835 A1    Jun. 15, 2017

(30) Foreign Application Priority Data

Dec. 9, 2015    (JP) .................................. 2015-240400

(51) Int. Cl.
| | | |
|---|---|---|
| *H03B 5/32* | (2006.01) | |
| *H03B 5/36* | (2006.01) | |
| *H03L 1/02* | (2006.01) | |
| *H03L 7/099* | (2006.01) | |

(52) U.S. Cl.
CPC ............. *H03L 7/0992* (2013.01); *H03B 5/32* (2013.01); *H03B 5/366* (2013.01); *H03L 1/022* (2013.01)

(58) Field of Classification Search
CPC .. H03B 5/00; H03B 5/32; H03L 1/022; H03L 7/0992
USPC .......................... 331/158, 116 FE, 177 V, 1 A
See application file for complete search history.

(56) References Cited

U.S. PATENT DOCUMENTS

| | | | | |
|---|---|---|---|---|
| 8,188,802 B2 * | 5/2012 | Garcia | ................... | H03B 5/366 |
| | | | | 331/15 |
| 8,766,736 B2 * | 7/2014 | Isik | ........................ | H03L 1/026 |
| | | | | 331/1 R |
| 2013/0033332 A1 | 2/2013 | Akaike et al. | | |
| 2015/0023388 A1 | 1/2015 | Tanabe | | |
| 2016/0156362 A1 * | 6/2016 | Kim | ........................ | H03L 7/189 |
| | | | | 327/159 |

FOREIGN PATENT DOCUMENTS

| | | |
|---|---|---|
| JP | H08-307256 A | 11/1996 |
| JP | H09-133753 A | 5/1997 |
| JP | H09-214336 A | 8/1997 |

(Continued)

OTHER PUBLICATIONS

Office Action issued in counterpart Japanese Application No. 2015-240400 dated May 21, 2019 (5 pages).

*Primary Examiner* — Arnold M Kinkead
(74) *Attorney, Agent, or Firm* — Osha Liang LLP

(57) ABSTRACT

In the frequency calibration circuit, the digital phase-locked-loop circuit repeats a calibration operation involving outputting the digital control signal corresponding to a time difference between the first clock signal which is input from the first oscillator and has a first frequency accuracy, and the second clock signal which is input from the second oscillator and has a second frequency accuracy lower than the first frequency accuracy, changing the capacitance of the discrete type capacitor bank in accordance with the digital control signal using the second oscillator as a digital control oscillator, and changing an oscillation frequency of the second clock signal in accordance with the capacitance of the discrete type capacitor bank, thereby calibrating a phase of the second clock signal to a phase of the first clock signal.

17 Claims, 7 Drawing Sheets

(56) References Cited

FOREIGN PATENT DOCUMENTS

| | | |
|---|---|---|
| JP | 2009-130587 A | 6/2009 |
| JP | 2010-206679 A | 9/2010 |
| JP | 2012-522466 A | 9/2012 |
| JP | 2013-051677 A | 3/2013 |
| JP | 2014-062816 | 4/2014 |
| JP | 2014-197746 A | 10/2014 |

* cited by examiner

FREQUENCY CALIBRATION CIRCUIT AND FREQUENCY CALIBRATION METHOD

CROSS-REFERENCE TO RELATED APPLICATIONS

The present application claims priority under 35 U.S.C. § 119 to Japanese Patent Application No. 2015-240400, filed on Dec. 9, 2015. The above application is hereby expressly incorporated by reference, in its entirety, into the present application.

BACKGROUND OF THE INVENTION

The present invention relates to a frequency calibration circuit and a frequency calibration method for calibrating an oscillation frequency of a clock signal output from an oscillator.

In a part of telecommunications standards or the like, a clock signal for controlling the operation of an internal circuit of a communication device is required to have a frequency accuracy of very high level, for instance, plus or minus 10 ppm (parts per million: $10^{-6}$). In order to achieve such frequency accuracy, a temperature compensated crystal oscillator (TCXO) that outputs clock signals in the MHz (megahertz: $10^6$ Hz) band is generally needed. However, a TCXO is disadvantageous in price and power consumption.

An oscillation frequency of a clock signal varies mainly due to the change in ambient temperature. In addition, an oscillator itself deteriorates with time. When a frequency accuracy of plus or minus 10 ppm is sought, because of the above and other factors, the frequency deviates from the desired value by plus or minus 1 to 2 ppm in 2 to 3 years, and that is a problem.

A communication device is now described.

A typical communication device often uses in combination two types of oscillators that output clock signals having different oscillation frequencies. Generally, clock signals output from the two types of oscillators are used for different purposes.

Of these, the first oscillator outputs clock signals in a double-digit MHz band, such as clock signals of 26 MHz, 32 MHz and 35 MHz, used for controlling the operation of an internal circuit of a communication device. The second oscillator outputs a clock signal of 32.768 kHz (kilohertz: $10^3$ Hz) used for controlling the operation of a real-time clock (RTC) that measures the current time.

The clock signal for controlling the operation of an internal circuit of a communication device may be required to have a frequency accuracy of very high level, as described above. On the other hand, the clock signal for controlling the operation of an RTC is not required to have high level frequency accuracy since it is only used in measuring the current time. In addition, RTCs are very widely used. For example, there is an inexpensive RTC that uses a TCXO, outputs clock signals having a frequency accuracy of plus or minus 10 ppm or less, and consumes a current of up to 1 μA.

Next, an oscillator that outputs clock signals for controlling the operation of an internal circuit of a communication device is described.

FIG. 10 is a circuit diagram showing an exemplary configuration of a crystal oscillator. A crystal oscillator 40 shown in FIG. 10 is composed of, in addition to a crystal oscillator element 22 of 32 MHz, load capacitors 25, 27, resistor elements 28, 30, an inverter 32 and a buffer 34 which constitute an oscillator circuit for causing the crystal oscillator element 22 to oscillate. The crystal oscillator element 22, load capacitors 25, 27 and resistor elements 28, 30 are placed outside a communication large scale integration (LSI) 36, while the inverter 32 and buffer 34 are placed in the communication LSI 36.

When the crystal oscillator 40 is used as an oscillator that outputs clock signals for controlling the operation of an internal circuit of a communication device, the clock signals have a frequency accuracy of plus or minus about 20 ppm, while the current consumption is about 200 μA. Thus a frequency accuracy of plus or minus 10 ppm is not achieved.

FIG. 11 is a circuit diagram showing another exemplary configuration of a crystal oscillator. A crystal oscillator 42 shown in FIG. 11 is obtained by, in the crystal oscillator 40 shown in FIG. 10, replacing the load capacitors 25, 27 by discrete type capacitor banks 24, 26 and placing the resistor elements 28, 30 in the communication LSI 36.

In this configuration, the layout area where the discrete type capacitor banks 24, 26 occupy is relatively large, and this increases the layout area of the communication LSI 36. Since, however, the number of external components can be reduced, the case of employing the crystal oscillator 42 of this configuration is increasing nowadays.

FIG. 12 is a circuit diagram showing an exemplary configuration of a TCXO. As shown in FIG. 12, a TCXO 18 of 32 MHz is set up outside the communication LSI 36, and clock signals output from the TCXO 18 are input to the buffer 34 placed in the communication LSI 36.

When the TCXO 18 is used as an oscillator that outputs clock signals for controlling the operation of an internal circuit of a communication device, the clock signals can have a frequency accuracy of plus or minus 10 ppm or less; however, the TCXO 18 is more expensive than the crystal oscillators 40, 42 and consumes a higher current, e.g., a current of about 2 mA.

In the meantime, references related to the present invention include JP 2014-197746 A, JP 2014-062816 A, JP 2013-051677 A, JP 9-214336 A and JP 9-133753 A.

JP 2014-197746 A describes a crystal oscillator detecting a difference in frequency between a reference frequency signal that is output from a reference crystal unit and is stable with respect to humidity and a frequency signal that is output from a humidity sensor and varies with humidity, outputting a correction voltage value corresponding to the detected difference using correction voltage values corresponding to differences as stored in advance, generating a correction voltage by digital-to-analog conversion of the correction voltage value, and outputting the correction voltage to a load capacitance circuit to thereby adjust an oscillation frequency of a crystal unit.

JP 2014-062816 A describes a quartz temperature measuring probe for generating a signal of a differential frequency component between an oscillation frequency of a signal that is generated using a first crystal unit having a temperature characteristic in which its oscillating frequency is stable with temperature, and an oscillation frequency of a signal that is generated using a second crystal unit having a temperature characteristic in which its oscillating frequency significantly changes with temperature, wherein the first and second crystal units are a combination which allows the frequency of the generated signal to be less than or equal to 10 kHz within a preset measuring temperature range.

JP 2013-051677 A describes a crystal oscillator obtaining a temperature detection value corresponding to a difference value between a value corresponding to a difference between an oscillation frequency f1 of a first oscillator circuit and an oscillation frequency f1r of the same at a reference temperature, and a value corresponding to a difference between an oscillation frequency f2 of a second oscillator circuit and an oscillation frequency f2r of the same at the reference temperature, and controlling power supply to a heating section that operates to keep the temperature uniform, based on the deviation between the temperature detection value and a set temperature value for the temperature of the atmosphere in which a crystal unit is placed.

JP 09-214336 A describes a double comparison type synthesizer oscillator comparing outputs of a voltage control oscillator separately with two reference clocks, detecting difference components of respective frequencies, dividing each of the difference components of the frequencies with a different division ratio as set, comparing divided frequencies, and generating a voltage signal proportional to an obtained frequency difference, thereby controlling a voltage controlling oscillator.

JP 09-133753 A describes a GPS receiver correcting an oscillation frequency of reference oscillation means based on an oscillation frequency of local oscillation means that oscillates a local oscillation frequency for frequency conversion means that converts a frequency of a received signal, an oscillation frequency of reference oscillation means that oscillates a frequency serving as a reference for the local oscillation means, and a clock oscillation frequency of clock oscillation means that oscillates a clock signal for signal processing means that performs signal processing on the received signal whose frequency has been converted by the frequency conversion means.

SUMMARY OF THE INVENTION

An object of the present invention is to solve drawbacks of the related art and provide a frequency calibration circuit and a frequency calibration method for calibrating an oscillation frequency of a clock signal output from an oscillator to thereby improve frequency accuracy without increasing the price or power consumption.

In order to attain the above object, the present invention provides a frequency calibration circuit including:

a first oscillator configured to output a first clock signal having a first frequency accuracy;

a second oscillator configured to output a second clock signal having a second frequency accuracy; and a digital phase-locked-loop circuit, wherein the second oscillator includes a discrete type capacitor bank having a plurality of discrete type capacitors whose capacitances change in binary and being configured to hold a digital control signal, capacitances of the plurality of discrete type capacitors being changed in accordance with the held digital control signal such that a capacitance of whole of the discrete type capacitor bank changes, and wherein the digital phase-locked-loop circuit repeats a calibration operation involving outputting the digital control signal corresponding to a time difference between the first clock signal and the second clock signal, changing the capacitance of the discrete type capacitor bank in accordance with the digital control signal using the second oscillator as a digital control oscillator, and changing an oscillation frequency of the second clock signal in accordance with the capacitance of the discrete type capacitor bank, thereby calibrating a phase of the second clock signal to a phase of the first clock signal.

Also the present invention provides a frequency calibration method including:

a step of outputting a first clock signal having a first frequency accuracy, with a first oscillator;

a step of holding a digital control signal, with a discrete type capacitor bank having a plurality of discrete type capacitors whose capacitances change in binary, capacitances of the plurality of discrete type capacitors being changed in accordance with the held digital control signal such that a capacitance of whole of the discrete type capacitor bank changes;

a step of outputting a second clock signal having a second frequency accuracy in accordance with the capacitance of the discrete type capacitor bank, with a second oscillator including the discrete type capacitor bank; and a step of calibrating a phase of the second clock signal to a phase of the first clock signal by repeating a calibration operation involving outputting the digital control signal corresponding to a time difference between the first clock signal and the second clock signal, changing the capacitance of the discrete type capacitor bank in accordance with the digital control signal using the second oscillator as a digital control oscillator, and changing an oscillation frequency of the second clock signal in accordance with the capacitance of the discrete type capacitor bank, with a digital phase-locked-loop circuit.

According to the present invention, the frequency accuracy of the second clock signal becomes equivalent to that of the first clock signal through calibration operation. Therefore, even when the frequency accuracy of the second clock signal changes after the calibration operation due to the change in ambient temperature or degradation of an oscillator element itself with time, the second clock signal can achieve a target frequency accuracy as long as the second clock signal after the change has a frequency accuracy higher than the target frequency accuracy.

The invention uses the discrete type capacitor banks having a large layout area as constituent elements of the digital control oscillator of the digital PLL circuit. As described above, however, a crystal oscillator having a load capacitor therein is often employed for recent communication LSIs. In addition, since the invention uses the second oscillator as the digital control oscillator, the use of the discrete type capacitor banks does not lead to the increase in layout area of the communication LSI.

After the calibration operation, the digital PLL circuit is set to the open loop position, the second oscillator is changed to the standby state, and the operation of the second oscillator is stopped. Therefore, the increase in power consumption due to the digital PLL circuit hardly occurs.

DETAILED DESCRIPTION OF THE INVENTION

On the following pages, the frequency calibration circuit and the frequency calibration method of the present invention are described in detail with reference to a preferred embodiment shown in the accompanying drawings.

Figure 1:
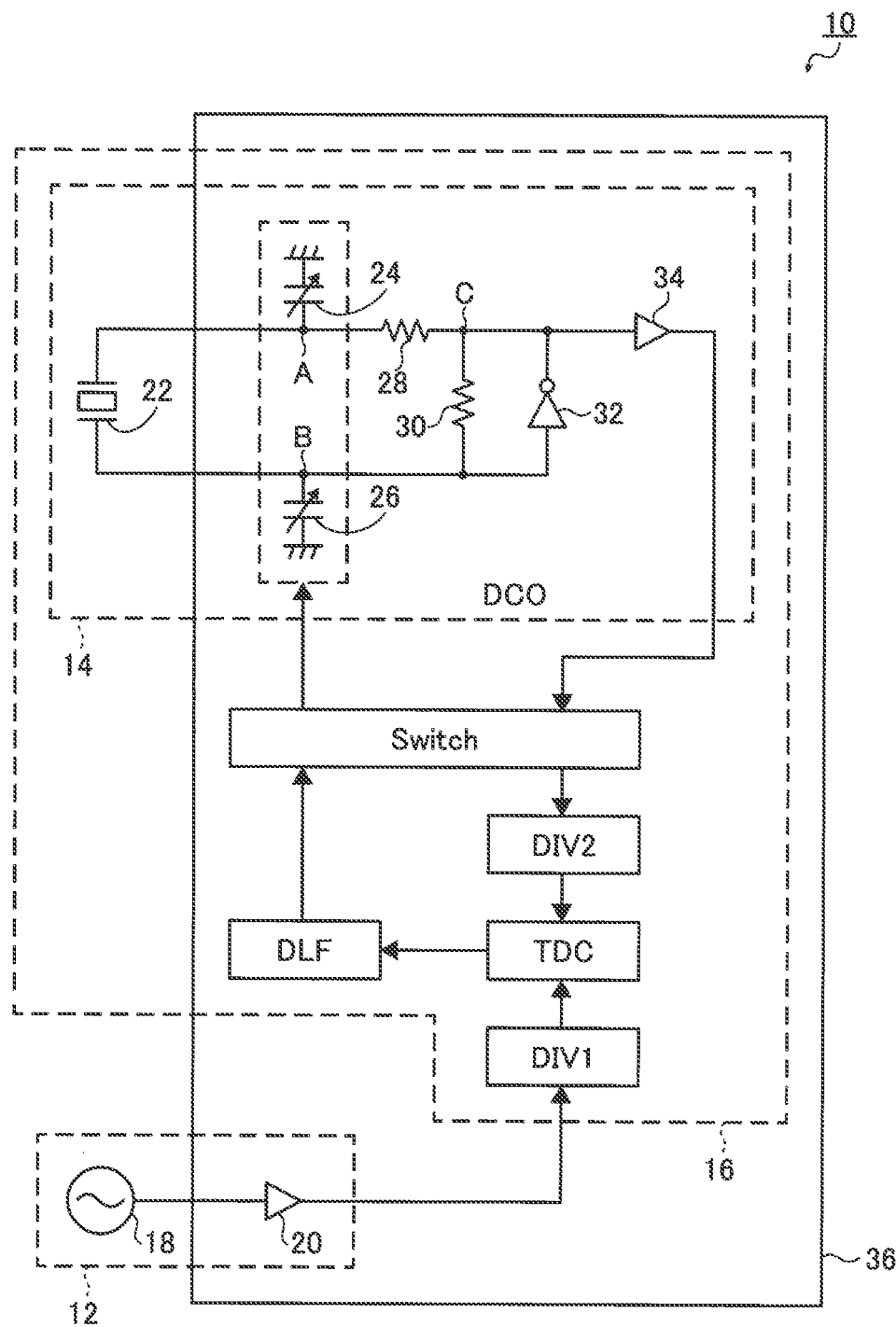
FIG. 1 is a circuit diagram of an embodiment for showing the configuration of a frequency calibration circuit of the invention.

FIG. 1 is a circuit diagram of an embodiment for showing the configuration of a frequency calibration circuit of the invention. A frequency calibration circuit 10 shown in FIG. 1 serves to calibrate an oscillation frequency of a clock signal for controlling the operation of an internal circuit of the communication LSI 36, using a clock signal for controlling the operation of an RTC of the communication LSI 36. The frequency calibration circuit 10 is composed of a first oscillator 12, a second oscillator 14 and a digital phase-locked-loop (PLL) circuit 16.

The first oscillator 12 serves to output a first clock signal having a first oscillation frequency with a first frequency accuracy, and is composed of the temperature compensated crystal oscillator (TCXO) 18 and a buffer 20.

In this embodiment, an oscillator that outputs the clock signal for controlling the operation of the RTC of the communication LSI 36 is used as the first oscillator 12. The first frequency accuracy is higher than a target frequency accuracy of the clock signal for controlling the operation of the internal circuit of the communication LSI 36.

The TCXO 18 serves to compensate a frequency temperature characteristic of a crystal oscillator element and outputs a clock signal with high frequency accuracy in a wide temperature range. In this embodiment, the TCXO 18 is one that outputs a clock signal having an oscillation frequency of 32.768 kHz and a frequency accuracy of plus or minus 5 ppm, while the target frequency accuracy of the clock signal for controlling the operation of the internal circuit of the communication LSI 36 is plus or minus 10 ppm.

A clock signal for controlling the operation of an RTC is not required to have high frequency accuracy as described above; however, since RTCs are very widely used, when a TCXO that outputs a clock signal having an oscillation frequency of 32.768 kHz is considered, a TCXO having a frequency accuracy of plus or minus 5 ppm as mentioned above, outputting a clock signal having an oscillation frequency of 32.768 kHz, and consuming a current of up to 1 μA can be used at relatively low price.

The buffer 20 receives a clock signal output from the TCXO 18 and outputs a first clock signal.

In the first oscillator 12, the TCXO 18 is placed outside the communication LSI 36, and the buffer 20 is placed in the communication LSI 36.

The second oscillator 14 is a digital oscillator that outputs a second clock signal having a second oscillation frequency higher than the first oscillation frequency with a second frequency accuracy lower than the first frequency accuracy. The second oscillator 14 is composed of, in addition to the crystal oscillator element 22, the discrete type capacitor banks 24, 26, resistor elements 28, 30, inverter 32 and buffer 34 which constitute an oscillator circuit for causing the crystal oscillator element 22 to oscillate.

The second oscillator 14 is an oscillator that outputs a clock signal for controlling the operation of the internal circuit of the communication LSI 36. The second frequency accuracy is lower than a target frequency accuracy of the second clock signal.

In this embodiment, the crystal oscillator element 22 oscillates at an oscillation frequency of 32 MHz and is connected between internal nodes A and B of the communication LSI 36.

The discrete type capacitor banks 24, 26 each have a plurality of discrete type capacitors whose capacitances change in binary. The discrete type capacitor banks 24, 26 each hold a digital control signal input from the digital PLL circuit 16, and when capacitances of the discrete type capacitors are changed in accordance with the held digital control signal, the capacitance of the whole of the discrete type capacitor bank 24 or 26 is changed. One terminals of the discrete type capacitor banks 24, 26 are respectively connected to the internal nodes A and B, and the other terminals thereof are connected to the ground.

One terminals of the resistor elements 28, 30 are respectively connected to the internal nodes A and B, and the other terminals thereof are connected to an internal node C.

An input terminal of the inverter 32 is connected to the internal node B, and an output terminal thereof is connected to the internal node C.

The buffer 34 receives an output signal of the inverter 32 and outputs the second clock signal.

In the second oscillator 14, the crystal oscillator element 22 is placed outside the communication LSI 36, while the discrete type capacitor banks 24, 26, resistor elements 28, 30, inverter 32 and buffer 34, which constitute an oscillator circuit, are placed in the communication LSI 36.

The digital PLL circuit 16 serves to calibrate or adjust the phase of the second clock signal to the phase of the first clock signal using the second oscillator 14 as a digital control oscillator DCO. The digital PLL circuit 16 is composed of a first divider DIV1, a second divider DIV2, a time to digital converter TDC, a digital loop filter DLF and a calibration operation control circuit Switch.

The first divider DIV1 divides the frequency of the first clock signal input from the first oscillator 12 to output a first frequency-divided signal.

The second divider DIV2 divides the frequency of the second clock signal input from the second oscillator 14 to output a second frequency-divided signal.

The time to digital converter TDC detects a time difference between the first frequency-divided signal input from the first divider DIV1 and the second frequency-divided signal input from the second divider DIV2, and converts the detected time difference into a digital value to output a digital time difference signal.

The digital loop filter DLF filters the digital time difference signal input from the time to digital converter TDC to remove a high frequency component and outputs a digital control signal from which the high frequency component has been removed.

Figure 2A:
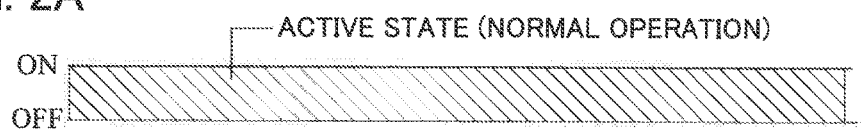
FIGS. 2A and 2B are conceptual diagrams of an example for respectively showing a continuous operation and an intermittent operation of a second oscillator.
Figure 2B:
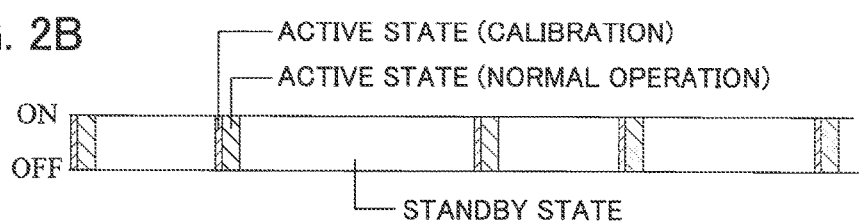

FIGS. 2A and 2B are conceptual diagrams of an example for respectively showing a continuous operation and an intermittent operation of the second oscillator. In each of FIGS. 2A and 2B, the horizontal axis represents elapsed time, and the vertical axis represents ON and OFF states of the oscillator element.

In mobile phones and the like, the continuous operation is carried out in which a mobile phone network is continuously in use irrespective of whether a telephone call or data communication is going on. In this case, as shown in FIG. 2A, the oscillator element is always in the ON state, and the second oscillator 14 is always in the active state.

In the case of the Internet of Things (IoT) and the like, the intermittent operation is carried out in which a wireless sensor network is used only when needed. In this case, as shown in FIG. 2B, the oscillator element is in the ON state and the second oscillator 14 is in the active state only while a wireless network needs to be used. In contrast, the oscillator element is in the OFF state and the second oscillator 14 is in the standby state when the wireless network does not need to be used in order to reduce power consumption.

The first oscillator 12 needs to measure the current time and is therefore always in the active state regardless of which operation is going on, the continuous operation or the intermittent operation.

The calibration operation control circuit Switch sets the digital PLL circuit 16 to the closed loop position to start a calibration operation when the second oscillator 14 is changed from the standby state to the active state in response to a status signal input from the outside of the frequency calibration circuit 10, and terminates the calibration operation by setting the digital PLL circuit 16 to the open loop position after the digital PLL circuit 16 has calibrated the phase of the second clock signal to the phase of the first clock signal.

In the frequency calibration circuit 10, the second oscillator 14 is used as the digital control oscillator DCO that is a constituent of the digital PLL circuit 16. The digital control oscillator DCO holds the digital control signal input from the digital loop filter DLF. The capacitances of the discrete type capacitor banks 24, 26 are changed in accordance with the digital control signal. The digital control oscillator DCO outputs the second clock signal whose oscillation frequency has been changed in accordance with the capacitances of the discrete type capacitor banks 24, 26.

Next, the operation of the frequency calibration circuit 10 when the second oscillator 14 intermittently operates is described.

In the frequency calibration circuit 10, the first oscillator 12 outputs a first clock signal having an oscillation frequency of 32.768 kHz and a frequency accuracy of plus or minus 5 ppm which is of a higher level than a target frequency accuracy of a second clock signal, with the target frequency accuracy being plus or minus 10 ppm. The second oscillator 14 in the initial state outputs the second clock signal having an oscillation frequency of 32 MHz and a frequency accuracy of plus or minus 20 ppm which is of a lower level than the target frequency accuracy of the second clock signal.

Figure 3:
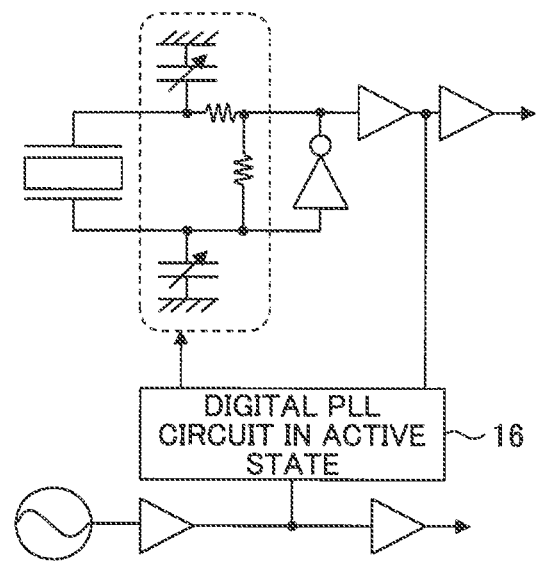
FIG. 3 is a conceptual diagram of an example showing the state where a digital PLL circuit is in an active state and in a closed loop position.

When the second oscillator 14 is first changed from the standby state to the active state in response to a status signal as shown in FIG. 2B, the calibration operation control circuit Switch sets the digital PLL circuit 16 to the active state and the closed loop position as shown in FIG. 3, and the calibration operation for calibrating the phase of the second clock signal to the phase of the first clock signal starts. In short, the calibration of oscillation frequency of the second clock signal starts.

When the digital PLL circuit 16 is brought to the closed loop position, the first divider DIV1 divides the frequency of the first clock signal of 32.768 kHz to obtain a $\frac{1}{16}$ oscillation frequency and outputs a first frequency-divided signal of 2.048 kHz as a comparison frequency. The second divider DIV2 divides the frequency of the second clock signal of 32 MHz to obtain a $\frac{1}{15625}$ oscillation frequency and outputs a second frequency-divided signal of about 2.048 kHz as a target frequency after calibration.

In other words, the frequencies of the first and second clock signals are divided to obtain the comparison frequency so that the first and second frequency-divided signals are subjected to integer division with respect to the target frequency of the second oscillator 14.

Subsequently, the time to digital converter TDC detects a time difference between the first and second frequency-divided signals, converts the detected time difference into a digital value, and outputs a digital time difference signal.

Subsequently, the digital loop filter DLF filters the digital time difference signal input from the time to digital converter TDC to remove a high frequency component and outputs a digital control signal from which the high frequency component has been removed.

Subsequently, using the second oscillator 14 as the digital control oscillator DCO, the capacitances of the discrete type capacitor banks 24, 26 are changed in accordance with the digital control signal, and the second clock signal whose oscillation frequency has been changed in accordance with the capacitances of the discrete type capacitor banks 24, 26 is output from the second oscillator 14.

Figure 5:
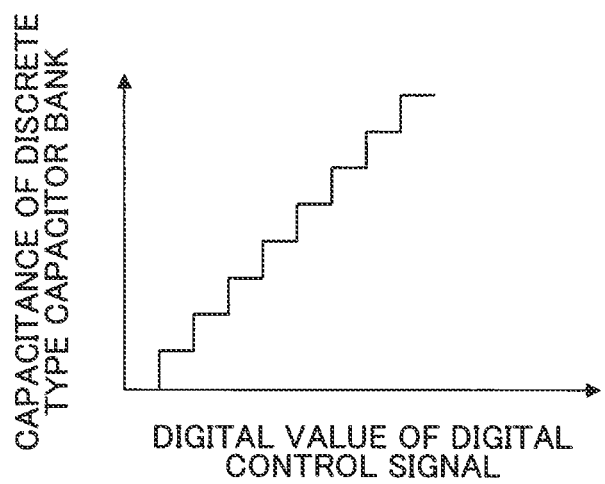
FIG. 5 is a graph of an example for showing the relation between a digital value of a digital control signal and a capacitance of a discrete type capacitor bank.

FIG. 5 is a graph of an example for showing the relation between a digital value of a digital control signal and a capacitance of a discrete type capacitor bank. In the graph of FIG. 5, the horizontal axis represents the digital value of the digital control signal, and the vertical axis represents the capacitance of the discrete type capacitor bank. From the example shown in this graph, it can be seen that the capacitance of the discrete type capacitor bank increases stepwise with increasing digital value of the digital control signal.

Figure 6:
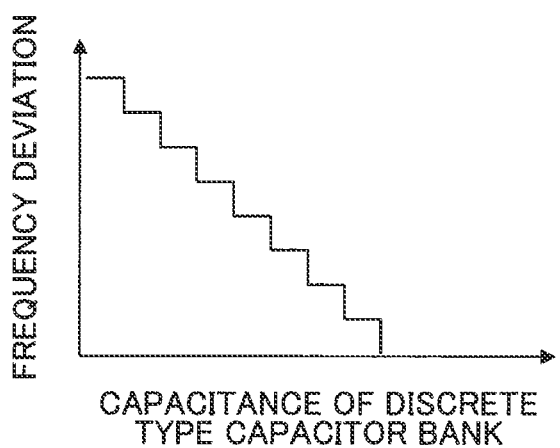
FIG. 6 is a graph of an example for showing the relation between the capacitance of the discrete type capacitor bank and a frequency deviation of a second clock signal.

FIG. 6 is a graph of an example for showing the relation between the capacitance of the discrete type capacitor bank and a frequency deviation of a second clock signal. In the graph of FIG. 6, the horizontal axis represents the capacitance of the discrete type capacitor bank, and the vertical axis represents the frequency deviation of the second clock signal (deviation with respect to a target frequency). From the example shown in this graph, it can be seen that the frequency deviation of the second clock signal (deviation with respect to the target frequency) decreases stepwise with increasing capacitance of the discrete type capacitor bank.

Figure 7:
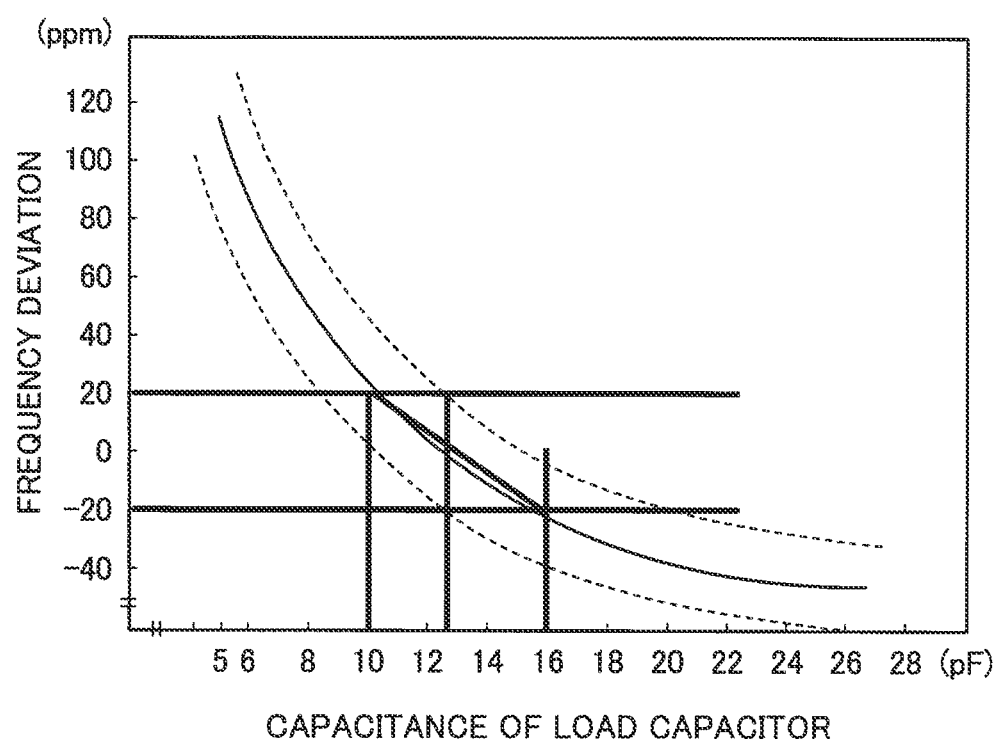
FIG. 7 is a graph of an example for showing the characteristics of a frequency deviation of a clock signal output from a crystal oscillator and a capacitance of a load capacitor.

FIG. 7 is a graph of an example for showing the characteristics of a frequency deviation of a clock signal output from a crystal oscillator and a capacitance of a load capacitor. In the graph of FIG. 7, the horizontal axis represents the capacitance of the load capacitor that constitutes the crystal oscillator, and the vertical axis represents the frequency deviation of the clock signal. From the example shown in this graph, it can be seen that as the capacitance of the load capacitance is changed within plus or minus 3 pF of about 13 pF, the frequency deviation of the clock signal is changed in a range of plus or minus 20 ppm.

For example, the case is considered where the digital value of a digital control signal changes in 512 stages, the capacitance of a discrete type capacitor bank is changed in a range of plus or minus 3 pF, and the frequency accuracy of a second clock signal is correctable in a range of plus or minus 20 ppm. In this case, the application of linear approximation enables the capacitance of the discrete type capacitor bank to change on an approximately 12 fF basis and the frequency deviation of the second clock signal to be controlled with an accuracy of about 0.1 ppm for one stage of the digital value of the digital control signal.

As described above, in the digital PLL circuit 16, the calibration operation is repeated in which the digital control signal corresponding to the time difference between the first clock signal and the second clock signal is output, the capacitances of the discrete type capacitor banks 24, 26 are changed in accordance with the digital control signal using the second oscillator 14 as the digital control oscillator DCO, and the oscillation frequency of the second clock signal is changed in accordance with the capacitances of the discrete type capacitor banks 24, 26, thereby calibrating the phase of the second clock signal to the phase of the first clock signal.

Figure 8A:
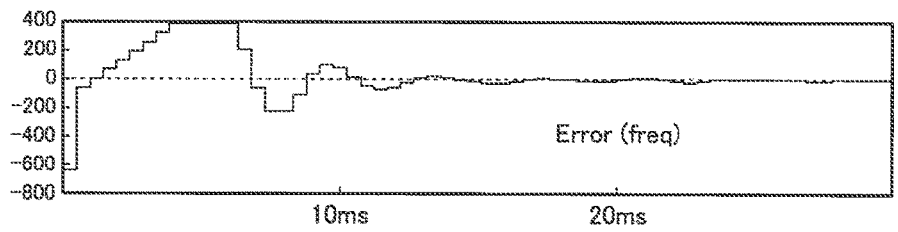
FIGS. 8A and 8B are graphs of an example for showing results of simulation of deviations of second clock signals with respect to a target oscillation frequency and with respect to a target frequency accuracy, respectively, when first and second frequency-divided signals are subjected to integer division.
Figure 8B:
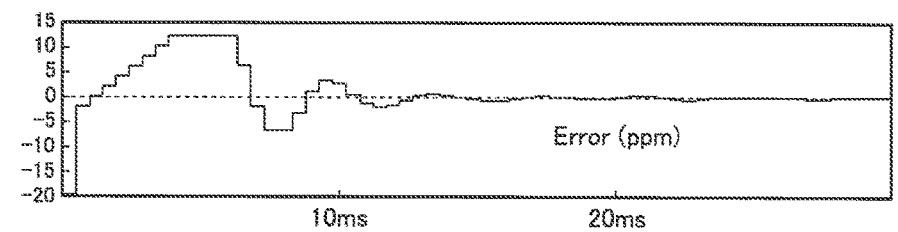

FIGS. 8A and 8B are graphs of an example for showing results of simulation of deviations of second clock signals with respect to a target oscillation frequency and with respect to a target frequency accuracy, respectively, when first and second frequency-divided signals are subjected to integer division. In the graphs of FIGS. 8A and 8B, the horizontal axes represent elapsed time. The vertical axes represent a deviation Error (freq) of the second clock signal with respect to the target oscillation frequency in FIG. 8A and a deviation (frequency deviation) Error (ppm) thereof with respect to the target frequency accuracy in FIG. 8B.

These graphs show results of simulation conducted under the conditions where the first clock signal is in the ideal state (with no frequency error) and has an oscillation frequency of 32.768 kHz and a frequency accuracy of plus or minus 5 ppm (i.e., plus or minus $163.84 \times 10^{-3}$ Hz), and the second clock signal before calibration has an oscillation frequency of 32 MHz and a frequency accuracy of plus or minus 20 ppm (i.e. plus or minus 640 Hz), with the target oscillation frequency of the second clock signal after calibration being 32 MHz and the target frequency accuracy thereof being plus or minus 10 ppm (i.e., 320 Hz).

As can be seen from the graphs, the deviation Error (freq) of the oscillation frequency of the second clock signal starts from about −600 Hz with respect to a deviation of the target oscillation frequency of 0 Hz, gradually increases toward the plus side to about +400 Hz, then gradually decreases toward the minus side to about −200 Hz. Thus the deviation Error (freq) repeats changes to the plus and minus sides and finally converges on the deviation of the target oscillation frequency of 0 Hz, that is, converges on the target oscillation frequency of 32 MHz.

Similarly, the deviation Error (ppm) of the frequency accuracy of the second clock signal starts from about −20 ppm with respect to a deviation of the target frequency accuracy of 0 ppm, gradually increases toward the plus side to about +12 ppm, then gradually decreases toward the minus side to about −7 ppm. Thus the deviation Error (ppm) repeats changes to the plus and minus sides and finally converges on the deviation of the target frequency accuracy of 0 ppm, that is, converges on the target frequency accuracy of plus or minus 10 ppm.

Figure 4:
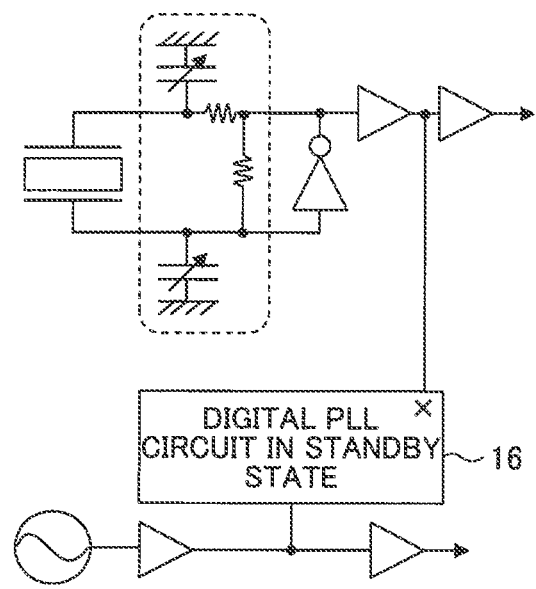
FIG. 4 is a conceptual diagram of an example showing the state where the digital PLL circuit is in a standby state and in an open loop position.

After the phase of the second clock signal is calibrated to the phase of the first clock signal, the calibration operation control circuit Switch sets the digital PLL circuit 16 to the standby state and the open loop position as shown in FIG. 4, and the calibration operation is finished. After this, the normal operation for communication is carried out.

The frequency accuracy of the second clock signal becomes plus or minus about 5 ppm which is equivalent to the frequency accuracy of the first clock signal, through the calibration operation. Therefore, even when the frequency accuracy of the second clock signal varies by, for example, plus or minus about 1 ppm after the calibration operation due to the change in ambient temperature or the degradation of an oscillator element itself with time, the frequency accuracy is still plus or minus about 6 ppm. Thus, the second clock signal can achieve a target frequency accuracy of plus or minus 10 ppm as long as the second clock signal after the variation has a frequency accuracy higher than the target frequency accuracy which is plus or minus 10 ppm.

Aside from that, the frequency calibration circuit 10 uses the discrete type capacitor banks 24, 26 having a large layout area as constituent elements of the digital control oscillator DCO of the digital PLL circuit 16. As described above, however, a crystal oscillator having a load capacitor therein is often employed for recent communication LSIs. In addition, since the frequency calibration circuit 10 uses the second oscillator 14 as the digital control oscillator DCO, the use of the discrete type capacitor banks 24, 26 does not lead to the increase in layout area of the communication LSI 36.

When the second oscillator 14 intermittently operates, as shown in FIG. 2B, the digital PLL circuit 16 is set to the open loop position and the standby state after the calibration operation, and the operation thereof is stopped. Therefore, power consumption by the digital PLL circuit 16 hardly increases.

The calibration operation control circuit Switch may set the digital PLL circuit 16 to the closed loop position to start the calibration operation on the oscillation frequency of the second clock signal every time the second oscillator 14 is changed from the standby state to the active state, and terminate the calibration operation by setting the digital PLL circuit 16 to the open loop position after the calibration operation.

A temperature sensor for measuring ambient temperature of the frequency calibration circuit 10 may be provided, and when the second oscillator 14 is changed from the standby state to the active state, the calibration operation control circuit Switch may set the digital PLL circuit 16 to the closed loop position to start the calibration operation only if the ambient temperature does not fall within a predetermined specific range, i.e., only if it varies more than previously specified, and after the calibration operation, set the digital PLL circuit 16 to the open loop position to terminate the calibration operation.

Similarly, a temperature sensor may be provided, and when the second oscillator 14 is changed from the standby state to the active state, the calibration operation control circuit Switch may set the digital PLL circuit 16 to the closed loop position to start the calibration operation only if the ambient temperature falls within a predetermined specific range and a predetermined period of time elapses after the last calibration operation, and after the calibration operation, set the digital PLL circuit 16 to the open loop position to terminate the calibration operation.

While the case where the second oscillator 14 intermittently operates is taken as an example and described above, the frequency calibration circuit 10 is applicable also to the case where the second oscillator 14 continuously operates as shown in FIG. 2A. In the case of continuous operation, the calibration operation cannot be carried out during communication, i.e., when the second clock signal is used. Accordingly, the communication may be temporarily stopped to carry out the calibration operation of the second clock signal.

For instance, a temperature sensor may be provided, and the calibration operation control circuit Switch may start the calibration operation every time the ambient temperature becomes out of a predetermined specific range when the second oscillator 14 is in the active state.

Similarly, a temperature sensor may be provided, and the calibration operation control circuit Switch may start the calibration operation every time a predetermined period of time elapses after the last calibration operation when the second oscillator 14 is in the active state and the ambient temperature falls within a predetermined specific range.

While the case where the first and second frequency-divided signals are subjected to integer division is taken as an example and described above, the invention is applicable to the case where at least one of the first and second frequency-divided signals is subjected to fractional division.

In this case, for instance, the first divider DIV1 outputs the first frequency-divided signal having an oscillation frequency of 32.768 kHz, which is obtained by dividing the frequency of the first clock signal of 32.768 kHz by 1, that is, which is not changed from the oscillation frequency of the first clock signal. The second divider DIV2 divides the frequency of the second clock signal of 32 MHz to obtain a $^{16}/_{15625}$ oscillation frequency and outputs the second frequency-divided signal of about 32.768 kHz.

That is, the first and second clock signals are divided so that the first and second frequency-divided signals are subjected to fractional division, i.e., that they have fractional oscillation frequencies that include a value after the decimal point.

Figure 9:
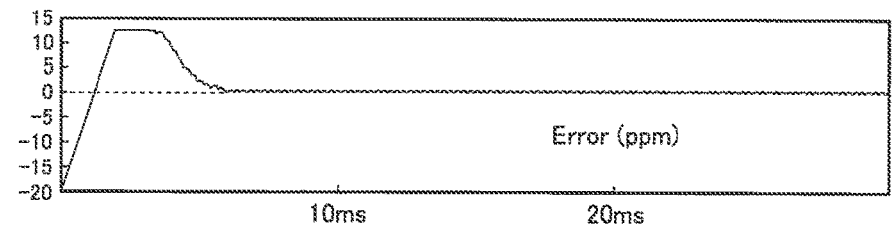
FIG. 9 is a graph of an example for showing a result of simulation of a deviation of a second clock signal with respect to a target frequency accuracy when first and second frequency-divided signals are subjected to fractional division.
Figure 10:
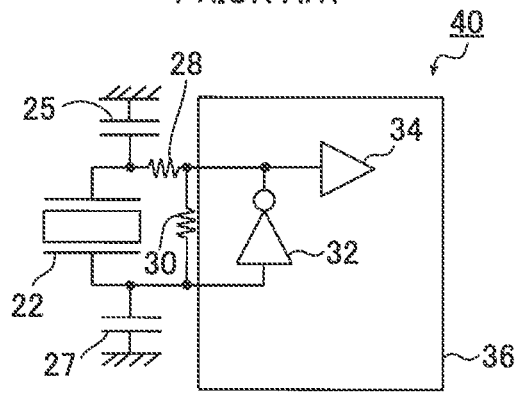
FIG. 10 is a circuit diagram showing an exemplary configuration of a crystal oscillator.
Figure 11:
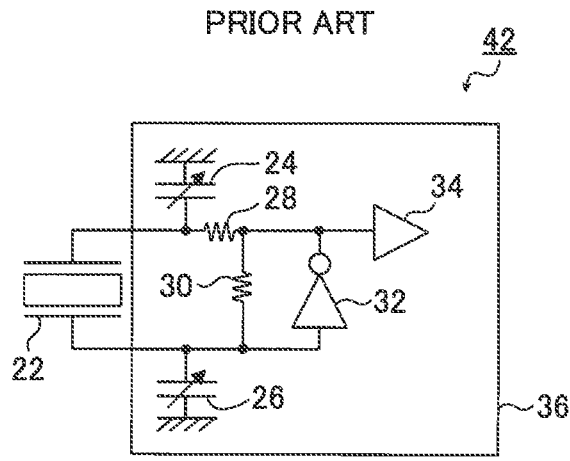
FIG. 11 is a circuit diagram showing another exemplary configuration of a crystal oscillator.
Figure 12:
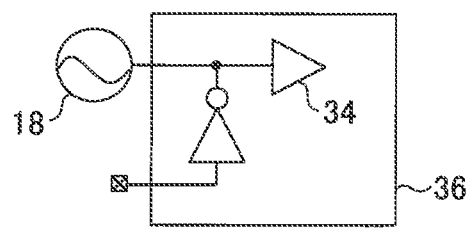
FIG. 12 is a circuit diagram showing an exemplary configuration of a TCXO.

FIG. 9 is a graph of an example for showing a result of simulation of a deviation of a second clock signal with respect to a target frequency accuracy when first and second frequency-divided signals are subjected to fractional division. In the graph of FIG. 9, the horizontal axis represents elapsed time, and the vertical axis represents, of a deviation (frequency deviation) of the second clock signal with respect to the target frequency accuracy, a deviation Error (ppm) associated only with integer portions of the first and second frequency-divided signals.

This graph shows a result of simulation conducted under the conditions where the first clock signal is in the ideal state (with no frequency error) and has an oscillation frequency of 32.768 kHz and a frequency accuracy of plus or minus 5 ppm (i.e., plus or minus $163.84 \times 10^{-3}$ Hz), and the second clock signal before calibration has an oscillation frequency of 32 MHz and a frequency accuracy of plus or minus 20 ppm (i.e. plus or minus 640 Hz), with the target oscillation frequency of the second clock signal after calibration being 32 MHz and the target frequency accuracy thereof being plus or minus 10 ppm (i.e., 320 Hz).

As can be seen from the graph, the deviation Error (ppm) of the frequency accuracy of the second clock signal starts from about −20 ppm with respect to a deviation of the target frequency accuracy of 0 ppm, gradually increases toward the plus side to about +12 ppm, then gradually decreases toward the minus side. Thus the deviation Error (ppm) repeats changes to the plus and minus sides and finally converges on the deviation of the target frequency accuracy of 0 ppm, that is, converges on the target frequency accuracy of plus or minus 10 ppm or less.

In the case of fractional division, after converging to the target frequency accuracy of plus or minus 10 ppm or less, the frequency accuracy of the second clock signal still repeats small changes by about 0.25 ppm to plus and minus sides from the center value of the target frequency accuracy of plus or minus 10 ppm.

As described above, when the second oscillator 14 intermittently operates, as shown in FIG. 2B, the digital PLL circuit 16 is set to the open loop position and the standby state after the calibration operation, and the operation thereof is stopped. Consequently, the above-mentioned small changes do not arise after the frequency accuracy of the second clock signal has converged on the target frequency accuracy, so that there is no influence on the normal operation for communication.

The use of a TCXO is not essential for the first oscillator 12, and the configuration of the first oscillator 12 is not limited as long as use is made of a constituent component that outputs a clock signal having a frequency accuracy higher than a target frequency accuracy. In addition, while an oscillator that outputs a clock signal for controlling the operation of an RTC is used as the first oscillator 12, the invention is not limited thereto and oscillators for other uses and an oscillator only for the frequency calibration circuit 10 may be used.

The use of the crystal oscillator element 22 is not essential for the second oscillator 14. Use may be made of various oscillator elements such as ceramic resonators, TCXOs, and micro electro mechanical systems (MEMS) oscillator elements. In addition, the second oscillator 14 is not limited in configuration as long as it has a discrete type capacitor bank and the oscillation frequency of the second clock signal changes in accordance with the capacitance of the discrete type capacitor bank.

While the present invention has been described in detail above, the invention is not limited to the above embodiment and various modifications and improvements may be made without departing from the spirit of the invention.

What is claimed is:

1. A frequency calibration circuit comprising:
 a first oscillator configured to output a first clock signal having a first frequency accuracy;
 a second oscillator configured to output a second clock signal having a second frequency accuracy;
 a calibration operation control circuit; and
 a digital phase-locked-loop circuit,
 wherein the second oscillator includes a discrete type capacitor bank having a plurality of discrete type capacitors whose capacitances change in binary and being configured to hold a digital control signal, capacitances of the plurality of discrete type capacitors being changed in accordance with the held digital control signal such that a capacitance of whole of the discrete type capacitor bank changes,
 wherein the digital phase-locked-loop circuit repeats a calibration operation involving outputting the digital control signal corresponding to a time difference between the first clock signal and the second clock signal, changing the capacitance of the discrete type capacitor bank in accordance with the digital control signal using the second oscillator as a digital control oscillator, and changing an oscillation frequency of the second clock signal in accordance with the capacitance of the discrete type capacitor bank, thereby calibrating a phase of the second clock signal to a phase of the first clock signal, and wherein the calibration operation control circuit is configured to set the digital phase-locked-loop circuit to a closed loop position to start the calibration operation when the second oscillator is first changed from a standby state to an active state, and terminate the calibration operation by setting the digital phase-locked-loop circuit to an open loop position after the phase of the second clock signal is calibrated to the phase of the first clock signal.

2. The frequency calibration circuit according to claim 1, wherein the first oscillator is a temperature compensated crystal oscillator.

3. The frequency calibration circuit according to claim 1, wherein the second oscillator includes:
an oscillator element; and
an oscillator circuit configured to cause the oscillator element to oscillate, the oscillator circuit including the discrete type capacitor bank and outputting the second clock signal whose oscillation frequency is changed in accordance with the capacitance of the discrete type capacitor bank, the capacitance of the discrete type capacitor bank being changed in accordance with the digital control signal.

4. The frequency calibration circuit according to claim 1, wherein the digital phase-locked-loop circuit includes:
a first divider configured to divide frequency of the first clock signal to output a first frequency-divided signal;
a second divider configured to divide frequency of the second clock signal to output a second frequency-divided signal;
a time to digital converter configured to convert a time difference between the first frequency-divided signal and the second frequency-divided signal into a digital value to output a digital time difference signal;
a digital loop filter configured to filter the digital time difference signal to output the digital control signal from which a high frequency component has been removed; and
the second oscillator as the digital control oscillator.

5. The frequency calibration circuit according to claim 4, wherein the first divider and the second divider respectively divide frequencies of the first clock signal and the second clock signal such that the first frequency-divided signal and the second frequency-divided signal are subjected to integer division.

6. The frequency calibration circuit according to claim 4, wherein the first divider and the second divider respectively divide frequencies of the first clock signal and the second clock signal such that at least one of the first frequency-divided signal and the second frequency-divided signal is subjected to fractional division.

7. The frequency calibration circuit according to claim 1, wherein the calibration operation control circuit starts the calibration operation every time the second oscillator is changed from the standby state to the active state.

8. The frequency calibration circuit according to claim 1, further comprising a temperature sensor configured to measure ambient temperature of the frequency calibration circuit,
wherein the calibration operation control circuit starts the calibration operation when the second oscillator is changed from the standby state to the active state and only if the ambient temperature does not fall within a predetermined specific range.

9. The frequency calibration circuit according to claim 1, further comprising a temperature sensor configured to measure ambient temperature of the frequency calibration circuit,
wherein the calibration operation control circuit starts the calibration operation every time the ambient temperature becomes out of a predetermined specific range when the second oscillator is in the active state.

10. The frequency calibration circuit according to claim 1, further comprising a temperature sensor configured to measure ambient temperature of the frequency calibration circuit,
wherein the calibration operation control circuit starts the calibration operation when the second oscillator is changed from the standby state to the active state and only if the ambient temperature falls within a predetermined specific range and a predetermined period of time elapses after a last calibration operation.

11. The frequency calibration circuit according to claim 1, further comprising a temperature sensor configured to measure ambient temperature of the frequency calibration circuit,
wherein the calibration operation control circuit starts the calibration operation every time a predetermined period of time elapses after a last calibration operation when the second oscillator is in the active state and the ambient temperature falls within a predetermined specific range.

12. A frequency calibration method comprising:
a step of outputting a first clock signal having a first frequency accuracy, with a first oscillator;
a step of holding a digital control signal, with a discrete type capacitor bank having a plurality of discrete type capacitors whose capacitances change in binary, capacitances of the plurality of discrete type capacitors being changed in accordance with the held digital control signal such that a capacitance of whole of the discrete type capacitor bank changes;
a step of outputting a second clock signal having a second frequency accuracy in accordance with the capacitance of the discrete type capacitor bank, with a second oscillator including the discrete type capacitor bank;
a step of calibrating a phase of the second clock signal to a phase of the first clock signal by repeating a calibration operation involving outputting the digital control signal corresponding to a time difference between the first clock signal and the second clock signal, changing the capacitance of the discrete type capacitor bank in accordance with the digital control signal using the second oscillator as a digital control oscillator, and changing an oscillation frequency of the second clock signal in accordance with the capacitance of the discrete type capacitor bank, with a digital phase-locked-loop circuit;
a step of setting, with a calibration operation control circuit, the digital phase-locked-loop circuit to a closed loop position to start the calibration operation when the second oscillator is first changed from a standby state to an active state; and
a step of terminating, with the calibration operation control circuit, the calibration operation by setting the digital phase-locked-loop circuit to an open loop position after the phase of the second clock signal is calibrated to the phase of the first clock signal.

13. The frequency calibration method according to claim 12, wherein the calibration operation control circuit starts the calibration operation every time the second oscillator is changed from the standby state to the active state.

14. The frequency calibration method according to claim 12, wherein the calibration operation control circuit starts the calibration operation when the second oscillator is changed from the standby state to the active state and only if ambient temperature measured by a temperature sensor does not fall within a predetermined specific range.

15. The frequency calibration method according to claim 12, wherein the calibration operation control circuit starts the calibration operation every time ambient temperature measured by a temperature sensor becomes out of a predetermined specific range when the second oscillator is in the active state.

16. The frequency calibration method according to claim 12, wherein the calibration operation control circuit starts the calibration operation when the second oscillator is changed from the standby state to the active state and only if ambient temperature measured by a temperature sensor falls within a predetermined specific range and a predetermined period of time elapses after a last calibration operation.

17. The frequency calibration method according to claim 12, wherein the calibration operation control circuit starts the calibration operation every time a predetermined period of time elapses after a last calibration operation when the second oscillator is in the active state and ambient temperature measured by a temperature sensor falls within a predetermined specific range.

* * * * *